United States Patent
Yan et al.

(10) Patent No.: US 9,589,506 B2
(45) Date of Patent: Mar. 7, 2017

(54) ORGANIC LIGHT EMITTING DEVICE, MANUFACTURING METHOD THEREOF, ORGANIC LIGHT EMITTING DISPLAY DEVICE AND DRIVING METHOD THEREOF

(71) Applicant: BOE TECHNOLOGY GROUP CO., LTD., Beijing (CN)

(72) Inventors: Guang Yan, Beijing (CN); Hongfei Cheng, Beijing (CN); Li Sun, Beijing (CN); Changyen Wu, Beijing (CN); Minghung Hsu, Beijing (CN); Shibo Jiao, Beijing (CN); Juanjuan You, Beijing (CN); Zhiqiang Jiao, Beijing (CN); Yanli Wang, Beijing (CN); Deming Liu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 29 days.

(21) Appl. No.: 14/442,794

(22) PCT Filed: Sep. 10, 2014

(86) PCT No.: PCT/CN2014/086209
§ 371 (c)(1),
(2) Date: May 14, 2015

(87) PCT Pub. No.: WO2015/165189
PCT Pub. Date: Nov. 5, 2015

(65) Prior Publication Data
US 2016/0284268 A1 Sep. 29, 2016

(30) Foreign Application Priority Data
Apr. 30, 2014 (CN) .......................... 2014 1 0181004

(51) Int. Cl.
G09G 3/3233 (2016.01)
G09G 3/32 (2016.01)
(Continued)

(52) U.S. Cl.
CPC ......... *G09G 3/3233* (2013.01); *G09G 3/2003* (2013.01); *G09G 3/32* (2013.01);
(Continued)

(58) Field of Classification Search
CPC . C07D 487/16; H05B 37/2063; H01L 27/156; H01L 5/5064
See application file for complete search history.

(56) References Cited
U.S. PATENT DOCUMENTS

2006/0038484 A1* 2/2006 Noh ..................... C07D 487/16
313/499
2011/0043124 A1* 2/2011 Johnston ............ H05B 37/0263
315/250
(Continued)

*Primary Examiner* — Gerald Johnson
(74) *Attorney, Agent, or Firm* — Nath, Goldberg & Meyer; Joshua B. Goldberg; Christopher Thomas

(57) ABSTRACT

The present invention discloses organic light emitting device, manufacturing method thereof, organic light emitting display device and driving method thereof. The organic light emitting device comprises a substrate and a first electrode layer, an organic layer and a second electrode layer positioned on the substrate, the organic layer is arranged between the first and second electrode layers, the first electrode layer, the organic layer and the second electrode layer form a laminated region for emitting light in a first specific color in a positive half cycle of alternating current and an inverted region for emitting light in a second specific color in a negative half cycle of alternating current, and at least portions of projections of the laminated region and the inverted region on the substrate are not overlapped. Tech-
(Continued)

nical solutions of the present invention render the organic light emitting device with adjustable light color and prolonged service life.

20 Claims, 1 Drawing Sheet

(51) Int. Cl.
*H01L 51/50* (2006.01)
*H01L 51/52* (2006.01)
*H01L 51/56* (2006.01)
*H01L 27/32* (2006.01)
*G09G 3/20* (2006.01)

(52) U.S. Cl.
CPC .............. *H01L 27/32* (2013.01); *H01L 51/50* (2013.01); *H01L 51/504* (2013.01); *H01L 51/52* (2013.01); *H01L 51/5206* (2013.01); *H01L 51/5221* (2013.01); *H01L 51/56* (2013.01); *G09G 2300/0426* (2013.01); *G09G 2300/0443* (2013.01); *G09G 2320/043* (2013.01); *G09G 2320/0626* (2013.01); *G09G 2320/0666* (2013.01); *H01L 2251/5361* (2013.01); *H01L 2251/564* (2013.01)

(56) References Cited

U.S. PATENT DOCUMENTS

2011/0062891 A1\* 3/2011 Chen ................... H01L 27/156
 315/294
2014/0054556 A1\* 2/2014 Park ................... H01L 51/5064
 257/40

\* cited by examiner

ORGANIC LIGHT EMITTING DEVICE, MANUFACTURING METHOD THEREOF, ORGANIC LIGHT EMITTING DISPLAY DEVICE AND DRIVING METHOD THEREOF

This is a National Phase Application filed under 35 U.S.C. 371 as a national stage of PCT/CN2014/086209, filed Sep. 10, 2014, an application claiming the benefit of Chinese Application No. 201410181004.4, filed Apr. 30, 2014, the content of each of which is hereby incorporated by reference in its entirety.

FIELD OF THE INVENTION

The present invention relates to the field of display technology, and particularly relates to an organic light emitting device, a manufacturing method thereof, an organic light emitting display device and a driving method thereof.

BACKGROUND OF THE INVENTION

The light color of a traditional light source such as an incandescent light source or a fluorescent light source falls into a predetermined spectral range, and the light color of a single light source cannot be randomly adjusted. To achieve an organic light emitting display device with adjustable color, a large quantity of the light sources must be assembled and the light intensity of these light sources must be controlled. However, the achieved organic light emitting display device with adjustable color has the disadvantages of low working efficiency, huge size, non-uniform spatial distribution of light color and the like.

On the other hand, an organic light emitting diode (referred to as OLED) has the advantages of autonomous light emission, wide viewing angle, quick response, high luminous efficiency, low working voltage, simple manufacturing procedure, low cost and the like. The basic working principle of the OLED is as follows: under the action of an electric field, electrons are injected from a cathode, holes are injected from an anode, the injected electrons and holes are transmitted in an organic layer and are radiatively recombined in a luminous layer to emit photons. Like a general diode, the organic light emitting diode has unidirectional conduction characteristics of forward conduction and reverse cut-off.

In the prior art, a single OLED has nonadjustable light color, and only has one light color; the OLED is driven in a direct-current driving manner, and in this way, the whole structure of the single OLED is lightened within a cycle, namely the whole structure is in a luminous state, so that the service life of the OLED is shortened.

SUMMARY OF THE INVENTION

The present invention provides an organic light emitting device, a manufacturing method thereof, and an organic light emitting display device and a driving method thereof, so as to enable the light color of the organic light emitting device to be adjustable and prolong the service life of the organic light emitting device.

To achieve the above object, the present invention provides an organic light emitting device, including a substrate and a first electrode layer, an organic layer and a second electrode layer, wherein the first electrode layer, the organic layer and the second electrode layer are positioned on the substrate; the organic layer is arranged between the first electrode layer and the second electrode layer, the first electrode layer, the organic layer and the second electrode layer form a laminated region and an inverted region; at least portions of projections of the laminated region and the inverted region on the substrate are not overlapped;

the laminated region is used for emitting light in a first specific color in a positive half cycle of alternating current; and the inverted region is used for emitting light in a second specific color in a negative half cycle of alternating current.

Optionally, the projections of the laminated region and the inverted region on the substrate are not overlapped at all.

Optionally, the organic layer includes a first luminous layer, a second luminous layer and a third luminous layer;

the first luminous layer and the second luminous layer are positioned in the laminated region, and the second luminous layer is positioned on the first luminous layer; and the third luminous layer is positioned in the inverted region.

Optionally, the organic layer further includes a first functional layer and a second functional layer, wherein the first functional layer is positioned on the first luminous layer, the third luminous layer is positioned on the first functional layer, the second functional layer is positioned on the third luminous layer, and the second luminous layer is positioned on the second functional layer; and the first functional layer and the second functional layer each are arranged in both the laminated region and the inverted region.

Optionally, the first functional layer is an N-type functional layer, and the second functional layer is a P-type functional layer.

Optionally, light color of the first luminous layer and light color of the second luminous layer form the first specific color, and light color of the third luminous layer forms the second specific color.

Optionally, in the positive half cycle, the first electrode layer serves as an anode, and the second electrode layer serves as a cathode; and in the negative half cycle, the first electrode layer serves as a cathode, and the second electrode layer serves as an anode.

Optionally, the first electrode layer is made of a high work function material, and the second electrode layer is made of a low work function material.

To achieve the above object, the present invention further provides an organic light emitting display device, including an organic light emitting device, which is the above organic light emitting device.

To achieve the above object, the present invention further provides a manufacturing method of an organic light emitting device, and the method includes steps of:

forming a first electrode layer on a substrate;

forming an organic layer on the first electrode layer; and forming a second electrode layer on the organic layer, wherein the first electrode layer, the organic layer and the second electrode layer form a laminated region and an inverted region, at least portions of projections of the laminated region and the inverted region on the substrate are not overlapped, the laminated region is used for emitting light in a first specific color in a positive half cycle of alternating current, and the inverted region is used for emitting light in a second specific color in a negative half cycle of alternating current.

Optionally, the organic layer includes a first luminous layer, a second luminous layer and a third luminous layer;

The step of forming an organic layer on the first electrode layer includes:

forming the first luminous layer on the first electrode layer, wherein the first luminous layer is positioned in the laminated region;

forming the third luminous layer on the first electrode layer, wherein the third luminous layer is positioned in the inverted region; and forming the second luminous layer on the first luminous layer, wherein the second luminous layer is positioned in the laminated region.

Optionally, the organic layer further includes a first functional layer and a second functional layer, which are arranged in both the laminated region and the inverted region;

the step of forming an organic layer on the first electrode layer further includes:

forming the first functional layer on the first luminous layer, wherein the third luminous layer is positioned on the first functional layer; and forming the second functional layer on the third luminous layer, wherein the second luminous layer is positioned on the second functional layer.

To achieve the above object, the present invention further provides a driving method of an organic light emitting display device, wherein the organic light emitting display device includes an organic light emitting device, which includes a substrate, a first electrode layer, an organic layer and a second electrode layer, wherein the first electrode layer, the organic layer and the second electrode layer are positioned on the substrate, the organic layer is arranged between the first electrode layer and the second electrode layer, the first electrode layer, the organic layer and the second electrode layer form a laminated region and an inverted region, and at least portions of projections of the laminated region and the inverted region on the substrate are not overlapped; and the driving method includes steps of:

applying a positive half cycle signal of alternating current to the laminated region, so that the laminated region emits light in a first specific color; and applying a negative half cycle signal of alternating current to the inverted region, so that the inverted region emits light in a second specific color.

The present invention has the following beneficial effects:

in the technical solutions of the organic light emitting device, the manufacturing method thereof, the organic light emitting display device and the driving method thereof provided by the present invention, the first electrode layer, the organic layer and the second electrode layer on the substrate form the laminated region that can emit light in the first specific color in the positive half cycle of alternating current and the inverted region that can emit light in the second specific color in the negative half cycle of alternating current, so that the light color of the organic light emitting device is adjustable. In addition, the laminated region and the inverted region of the organic light emitting device alternatively emit light in a cycle of alternating current, so that the service life of the organic light emitting device is prolonged.

DETAILED DESCRIPTION OF THE EMBODIMENTS

To make those skilled in the art better understand the technical solutions of the present invention, an organic light emitting device, a manufacturing method thereof, an organic light emitting display device and a driving method thereof of the present invention will be described in detail below in combination with the accompanying drawings.

Figure 1:
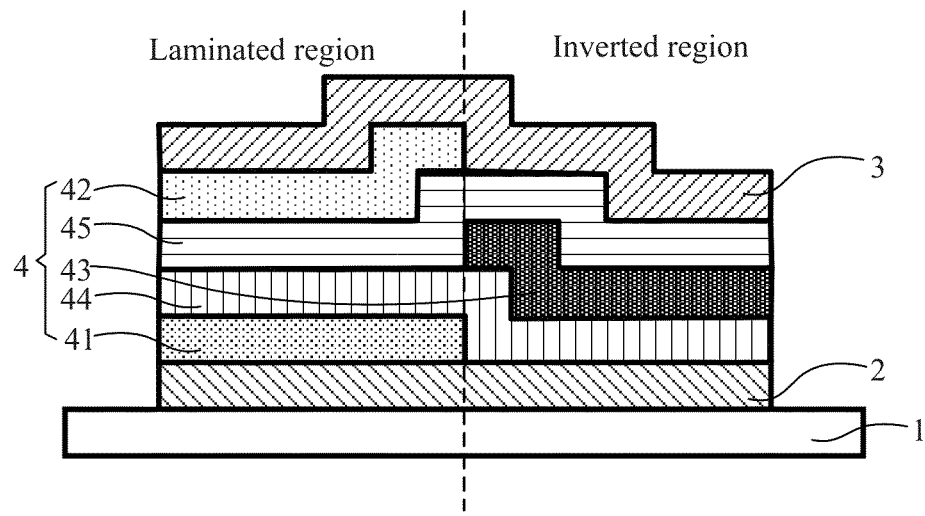
FIG. 1 is a schematic diagram of a structure of an organic light emitting device according to a first embodiment of the present invention.

FIG. 1 is a schematic diagram of a structure of an organic light emitting device according to a first embodiment of the present invention. As shown in FIG. 1, the organic light emitting device includes a substrate 1, a first electrode layer 2, an organic layer 4 and a second electrode layer 3, wherein the first electrode layer 2, the organic layer 4 and the second electrode layer 3 are positioned on the substrate 1, and the organic layer 4 is arranged between the first electrode layer 2 and the second electrode layer 3. The first electrode layer 2, the organic layer 4 and the second electrode layer 3 form a laminated region and an inverted region, and at least portions of projections of the laminated region and the inverted region on the substrate 1 are not overlapped. The laminated region is used for emitting light in a first specific color in a positive half cycle of alternating current, and the inverted region is used for emitting light in a second specific color in a negative half cycle of alternating current.

In this embodiment, the organic light emitting device may be an OLED.

Preferably, the projections of the laminated region and the inverted region on the substrate 1 are not overlapped at all. Specifically, there are two conditions in which the projections are not overlapped at all: the projections of the laminated region and the inverted region on the substrate 1 are in contact with each other (the condition shown in FIG. 1), or a certain distance exists between the projections of the laminated region and the inverted region on the substrate 1 (this condition is not shown).

In practical application, there is also a condition in which the projections of the laminated region and the inverted region on the substrate 1 are partially overlapped.

As shown in FIG. 1, in an organic light emitting device, the laminated region is arranged on the left side of the inverted region. In practical application, the laminated region may be arranged on the right side of the inverted region, and this condition is not specifically described.

In this embodiment, the organic layer 4 may include a first luminous layer 41, a second luminous layer 42 and a third luminous layer 43. The first luminous layer 41 and the second luminous layer 42 are positioned in the laminated region, and the second luminous layer 42 is positioned on the first luminous layer 41. The third luminous layer 43 is positioned in the inverted region. Specifically, the first luminous layer 41 is positioned on the first electrode layer 2, and the second electrode layer 3 is positioned on the second luminous layer 42. Specifically, the case in which the projections of the laminated region and the inverted region on the substrate 1 are in contact with each other is specifically the case in which the projections, on the substrate 1, of the first luminous layer 41 and the second luminous layer 42 positioned in the laminated region are in contact with the projection, on the substrate 1, of the third luminous layer 43 positioned in the inverted region; the case in which a certain distance exists between the projections of the laminated region and the inverted region on the substrate 1 is specifically the case in which a certain distance exists between the projections, on the substrate 1, of the first luminous layer 41 and the second luminous layer 42 positioned in the laminated region and the projection, on the substrate 1, of the third luminous layer 43 positioned in the inverted region; and the case in which the projections of the laminated region and the inverted region on the substrate 1 are partially overlapped is specifically the case in which the projections, on the substrate 1, of the first luminous layer 41 and the second luminous layer 42 positioned in the laminated region are partially overlapped with the projection, on the substrate 1, of the third luminous layer 43 positioned in the inverted region.

Further, the organic layer 4 may include a first functional layer 44 and a second functional layer 45, the first functional layer 44 is positioned on the first luminous layer 41, the third luminous layer 43 is positioned on the first functional layer 44, the second functional layer 45 is positioned on the third luminous layer 43, the second luminous layer 42 is positioned on the second functional layer 45, and the first functional layer 44 and the second functional layer 45 are arranged in both the laminated region and the inverted region.

In this embodiment, the first functional layer 44 is an N-type functional layer, and the second functional layer 45 is a P-type functional layer.

Preferably, the N-type functional layer is made of a first host material and a first dopant material. For example, the first host material includes tris(8-hydroxy)-quinoline-aluminium (referred to as Alq3), and the first dopant material includes lithium (Li), magnesium (Mg) or 8-hydroxyquinolinolato-lithium (referred to as LiQ).

Preferably, the P-type functional layer is made of a second host material and a second dopant material. For example, the second host material includes N,N'-bis(1-naphthyl)-N,N'-diphenyl-1,1'-biphenyl-4,4'-diamine (referred to as NPB), N,N'-Bis(3-methylphenyl)-N,N'-diphenylbenzidine (referred to as TPD), 4,4',4"-tris-(N-carbazolyl)-triphenylamine (referred to as TCTA) or 1,1-bis[(di-4-tolylamino)phenyl]cyclohexane (referred to as TAPC), and the second dopant material includes 1,4,5,8,9,11-hexaazatriphenylene hexacarbonitrile (referred to as HAT-CN) or tetrafluro-tetracyano-quinodimethane (referred to as F4-TCNQ).

Alternatively, preferably, the P-type functional layer may be made of a metal oxide, e.g. molybdenum trioxide (MoO3).

The light colors of the first luminous layer 41, the second luminous layer 42 and the third luminous layer 43 or any combination thereof may be identical; or the light colors of the first luminous layer 41, the second luminous layer 42 and the third luminous layer 43 are all different. The first specific color and the second specific color may be identical or different. In this embodiment, the light color of the first luminous layer 41 and the light color of the second luminous layer 42 form the first specific color, the light color of the third luminous layer 43 forms the second specific color, and the first specific color is different from the second specific color. Preferably, the light colors of the first luminous layer 41, the second luminous layer 42 and the third luminous layer 43 are all different, and then the first specific color is different from the second specific color. For example, the light color of the first luminous layer 41 is red, the light color of the second luminous layer 42 is green, and accordingly the formed first specific color is yellow; the light color of the third luminous layer 43 is blue, and accordingly the formed second specific color is blue.

In this embodiment, in a positive half cycle, the first electrode layer 2 serves as an anode, and the second electrode layer 3 serves as a cathode; and in a negative half cycle, the first electrode layer 2 serves as a cathode, and the second electrode layer 3 serves as an anode.

In this embodiment, preferably, the first electrode layer 2 is made of a high work function material, which may be a transparent conductive material, e.g. indium tin oxide (ITO); and the second electrode layer 3 is made of a low work function material, which may be a metal, e.g. aluminum (Al).

In practical application, optionally, the first electrode layer 2 and the second electrode layer 3 may be made of the same material, e.g. a transparent conductive material.

The working process of the organic light emitting device provided by this embodiment will be described in detail below by using a specific example.

The organic light emitting device of this embodiment is driven in an alternating-current driving manner. Each cycle of alternating current includes two half cycles, which are respectively a positive half cycle and a negative half cycle. In a cycle of alternating current, if the laminated region emits light first and then the inverted region emits light, the first half cycle in each cycle is the positive half cycle, and the second half cycle is the negative half cycle; and in a cycle of alternating current, if the inverted region emits light first and then the laminated region emits light, the first half cycle in each cycle is the negative half cycle, and the second half cycle is the positive half cycle.

The embodiment is described by taking a case in which the laminated region emits light first and then the inverted region emits light as an example. In this embodiment, the first functional layer 44 is made of a first host material Alq3 and a first dopant material Li, namely the material of the first functional layer 44 is Alq3: Li; the second functional layer 45 is made of MoO3; the first electrode layer 2 is made of ITO, and the second electrode layer 3 is made of Al. The first functional layer 44 and the second functional layer 45 which are in contact with each other in the laminated region form a charge generate layer (referred to as CGL) to generate electrons and holes, the first functional layer 44 may inject electrons to the first luminous layer 41 or the third luminous layer 43, and the second functional layer 45 may inject holes to the second luminous layer 42 or the third luminous layer 43. In conclusion, the first functional layer 44 and the second functional layer 45 not only play a role of the charge generate layer but also play a role of a charge transmission layer. Specifically, when alternating current is applied to the organic light emitting device, in the positive half cycle, the first electrode layer 2 serves as an anode, the second electrode layer 3 serve as a cathode, at this point, the first electrode layer 2 injects holes to the first luminous layer 41, the first functional layer 44 injects electrons to the first luminous layer 41, and the injected holes and electrons are radiatively recombined in the first luminous layer 41 to emit photons, so that the first luminous layer 41 emits light; meanwhile, the second electrode layer 3 injects electrons to the second luminous layer 42, the second functional layer 45 injects holes to the second luminous layer 42, and the injected holes and electrons are radiatively recombined in the second luminous layer 42 to emit photons, so that the second luminous layer 42 emits light. The first luminous layer 41 and the second luminous layer 42 both emit light, so that the laminated region emits light in the positive half cycle. In the negative half cycle, the first electrode layer 2 serves as a cathode, the second electrode layer 3 serves as an anode, holes are injected from the second electrode layer 3 to the second functional layer 45 and then injected from the second functional layer 45 to the third luminous layer 43, electrons are injected from the first electrode layer 2 to the first functional layer 44 and then injected from the first functional layer 44 to the third luminous layer 43, and the injected holes and electrons are radiatively recombined in the third luminous layer 43 to emit photons, so that the third luminous layer 43 emits light, namely the inverted region emits light in the negative half cycle. In this way, the laminated region and the inverted region of the organic light emitting device alternatively emit light in each cycle, so that the service life of the organic light emitting device is prolonged. According to actual needs, the first specific color and the second specific color may be set to be different colors, which enables the organic light emitting device to emit light of a color through the laminated region in the positive half cycle and emit light of a different color through the inverted region in the negative half cycle, so that the light color of the organic light emitting device is adjustable.

In the technical solution of the organic light emitting device provided by this embodiment, the first electrode layer, the organic layer and the second electrode layer on the substrate form the laminated region that can emit light in the first specific color in the positive half cycle of alternating current and the inverted region that can emit light in the second specific color in the negative half cycle of alternating current, so that the light color of the organic light emitting device is adjustable. In addition, the laminated region and the inverted region of the organic light emitting device alternatively emit light in a cycle of alternating current, so that the service life of the organic light emitting device is prolonged.

According to a second embodiment of the present invention, there is provided an organic light emitting display device, which may include an organic light emitting device. The organic light emitting device may be the organic light emitting device according to the first embodiment, and is not specifically described herein.

Optionally, the organic light emitting display device may include a surface light source or a back light source.

In the technical solution of the organic light emitting display device provided by this embodiment, the first electrode layer, the organic layer and the second electrode layer on the substrate form the laminated region that can emit light in the first specific color in the positive half cycle of alternating current and the inverted region that can emit light in the second specific color in the negative half cycle of alternating current, so that the light color of the organic light emitting device is adjustable. In addition, the laminated region and the inverted region of the organic light emitting device alternatively emit light in a cycle of alternating current, so that the service life of the organic light emitting device is prolonged.

Figure 2:
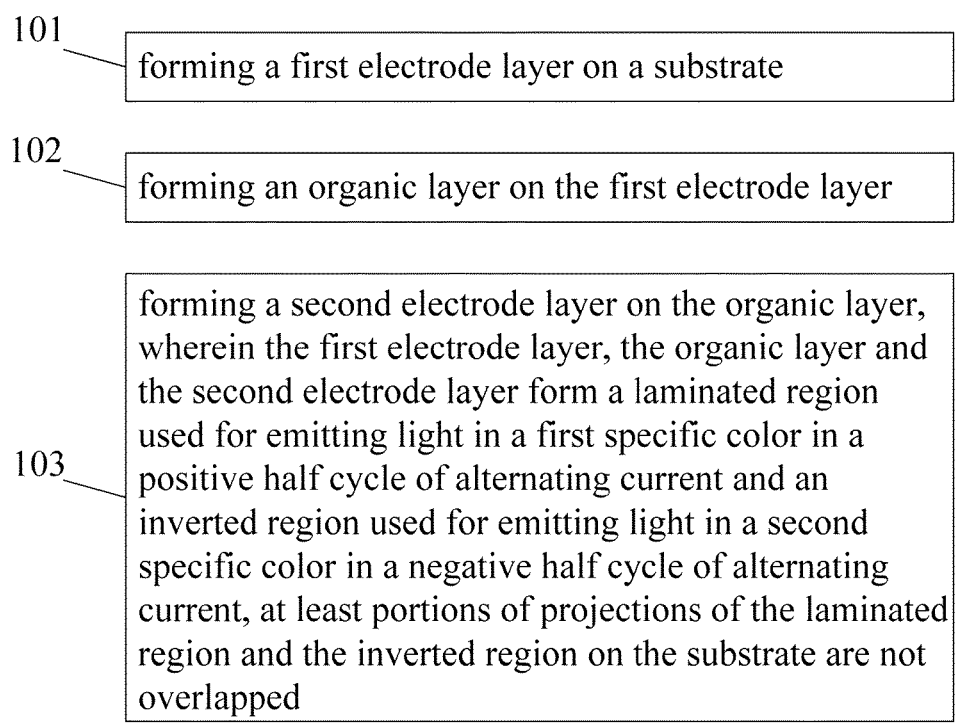
FIG. 2 is a flow chart of a manufacturing method of an organic light emitting device according to a third embodiment of the present invention.

FIG. 2 is a flow chart of a manufacturing method of an organic light emitting device according to a third embodiment of the present invention. As shown in FIG. 2, the method includes steps 101 to 103.

At step 101, a first electrode layer is formed on a substrate.

Specifically, the first electrode layer may be formed on the substrate through a patterning process. The patterning process may include processes such as photoresist application, exposing, developing, etching, photoresist removal and the like.

At step 102, an organic layer is formed on the first electrode layer.

In this embodiment, the organic layer may include a first luminous layer, a second luminous layer and a third luminous layer. Accordingly, step 102 may specifically include:

step 1021, forming the first luminous layer on the first electrode layer, wherein the first luminous layer is positioned in the laminated region;

step 1022, forming the third luminous layer on the first electrode layer, wherein the third luminous layer is positioned in the inverted region; and step 1023, forming the second luminous layer on the first luminous layer, wherein the second luminous layer is positioned in the laminated region.

Further, the organic layer may include a first functional layer and a second functional layer, which are arranged in both the laminated region and the inverted region.

The following step is further included between step 1021 and step 1022: forming the first functional layer on the first luminous layer, wherein the third luminous layer is positioned on the first functional layer. Step 1022 may specifically include: forming the third luminous layer on the first functional layer.

The following step is further included between step 1022 and step 1023: forming the second functional layer on the third luminous layer, wherein the second luminous layer is positioned on the second functional layer. Step 1023 may specifically include: forming the second luminous layer on the second functional layer.

Specifically, each layer in the organic layer may be formed by evaporation, printing, laser transfer printing or other process.

At step 103, a second electrode layer is formed on the organic layer, wherein the first electrode layer, the organic layer and the second electrode layer form a laminated region and an inverted region, at least portions of projections of the laminated region and the inverted region on the substrate are not overlapped, the laminated region is used for emitting light in a first specific color in a positive half cycle of alternating current, and the inverted region is used for emitting light in a second specific color in a negative half cycle of alternating current.

Specifically, this step may include: forming the second electrode layer on the second luminous layer.

Specifically, the second electrode layer may be formed by sputtering, evaporation or other process.

The manufacturing method of an organic light emitting device provided by this embodiment may be used for manufacturing the organic light emitting device according to the first embodiment, and the description of the organic light emitting device may refer to the first embodiment, and is not specifically described herein.

In the organic light emitting device manufactured by adopting the manufacturing method of an organic light emitting device according to this embodiment, the first electrode layer, the organic layer and the second electrode layer on the substrate form the laminated region that can emit light in the first specific color in the positive half cycle of alternating current and the inverted region that can emit light in the second specific color in the negative half cycle of alternating current, so that the light color of the organic light emitting device is adjustable. In addition, the laminated region and the inverted region of the organic light emitting device alternatively emit light in a cycle of alternating current, so that the service life of the organic light emitting device is prolonged.

According to a fourth embodiment of the present invention, there is provided a driving method of an organic light emitting display device, wherein the organic light emitting display device includes an organic light emitting device, which includes a substrate, a first electrode layer, an organic layer and a second electrode layer, wherein the first electrode layer, the organic layer and the second electrode layer are positioned on the substrate, the organic layer is arranged between the first electrode layer and the second electrode layer, the first electrode layer, the organic layer and the second electrode layer form a laminated region and an inverted region, and at least portions of projections of the laminated region and the inverted region on the substrate are not overlapped; and the driving method includes steps 201 and 202.

At step 201, a positive half cycle signal of alternating current is applied to the laminated region, so that the laminated region emits light in a first specific color.

The laminated region emits light in the first specific color in the positive half cycle of alternating current.

At step 202, a negative half cycle signal of alternating current is applied to the inverted region, so that the inverted region emits light in a second specific color.

The inverted region emits light in the second specific color in the negative half cycle of alternating current.

In practical application, the performing sequence of step 201 and step 202 may be changed.

The driving method of an organic light emitting display device provided by this embodiment may be used for driving the organic light emitting display device according to the second embodiment, and the specific description thereof may refer to the second embodiment.

In the driving method of an organic light emitting display device according to this embodiment, the positive half cycle signal of alternating current is applied to the laminated region so that the laminated region emits light in the first specific color, the negative half cycle signal of alternating current is applied to the inverted region so that the inverted region emits light in the second specific color, and thus the light color of the organic light emitting device is adjustable. In addition, the laminated region and the inverted region of the organic light emitting device alternatively emit light in a cycle of alternating current, so that the service life of the organic light emitting device is prolonged.

It could be understood that, the above embodiments are merely exemplary embodiments adopted for describing the principle of the present invention, rather than limiting the present invention. Various modifications and improvements may be made for those of ordinary skill in the art without departing from the spirit and essence of the present invention, and these modifications and improvements are interpreted as within the protection scope of the present invention.

The invention claimed is:

1. An organic light emitting device, comprising a substrate, a first electrode layer, an organic layer and a second electrode layer, wherein the first electrode layer, the organic layer and the second electrode layer are positioned on the substrate; the organic layer is arranged between the first electrode layer and the second electrode layer; the first electrode layer, the organic layer and the second electrode layer form a laminated region and an inverted region, a structure of the organic layer in the laminated region is different from a structure of the organic layer in the inverted region, at least portions of projections of the laminated region and the inverted region on the substrate are not overlapped;

the laminated region is used for emitting light in a first specific color in a positive half cycle of alternating current; and the inverted region is used for emitting light in a second specific color in a negative half cycle of alternating current.

2. The organic light emitting device of claim 1, wherein the projections of the laminated region and the inverted region on the substrate are not overlapped at all.

3. The organic light emitting device of claim 1, wherein the organic layer comprises a first luminous layer, a second luminous layer and a third luminous layer;

the first luminous layer and the second luminous layer are positioned in the laminated region, and the second luminous layer is positioned on the first luminous layer; and the third luminous layer is positioned in the inverted region.

4. The organic light emitting device of claim 3, wherein the organic layer further comprises a first functional layer and a second functional layer, the first functional layer is positioned on the first luminous layer, the third luminous layer is positioned on the first functional layer, the second functional layer is positioned on the third luminous layer, and the second luminous layer is positioned on the second functional layer; and the first functional layer and the second functional layer each are arranged in both the laminated region and the inverted region.

5. The organic light emitting device of claim 4, wherein the first functional layer is an N-type functional layer, and the second functional layer is a P-type functional layer.

6. The organic light emitting device of claim 3, wherein light color of the first luminous layer and light color of the second luminous layer form the first specific color, and light color of the third luminous layer forms the second specific color.

7. The organic light emitting device of claim 1, wherein in the positive half cycle, the first electrode layer serves as an anode, and the second electrode layer serves as a cathode; and in the negative half cycle, the first electrode layer serves as a cathode, and the second electrode layer serves as an anode.

8. The organic light emitting device of claim 1, wherein the first electrode layer is made of a high work function material, and the second electrode layer is made of a low work function material.

9. An organic light emitting display device, comprising the organic light emitting device of claim 1.

10. The organic light emitting display device of claim 9, wherein the projections of the laminated region and the inverted region on the substrate are not overlapped at all.

11. The organic light emitting display device of claim 9, wherein the organic layer comprises a first luminous layer, a second luminous layer and a third luminous layer;

the first luminous layer and the second luminous layer are positioned in the laminated region, and the second luminous layer is positioned on the first luminous layer; and the third luminous layer is positioned in the inverted region.

12. The organic light emitting display device of claim 11, wherein the organic layer further comprises a first functional layer and a second functional layer, the first functional layer is positioned on the first luminous layer, the third luminous layer is positioned on the first functional layer, the second functional layer is positioned on the third luminous layer, and the second luminous layer is positioned on the second functional layer; and the first functional layer and the second functional layer each are arranged in both the laminated region and the inverted region.

13. The organic light emitting display device of claim 12, wherein the first functional layer is an N-type functional layer, and the second functional layer is a P-type functional layer.

14. The organic light emitting display device of claim 11, wherein light color of the first luminous layer and light color of the second luminous layer form the first specific color, and light color of the third luminous layer forms the second specific color.

15. The organic light emitting display device of claim 9, wherein in the positive half cycle, the first electrode layer serves as an anode, and the second electrode layer serves as a cathode; and in the negative half cycle, the first electrode layer serves as a cathode, and the second electrode layer serves as an anode.

16. The organic light emitting display device of claim 9, wherein the first electrode layer is made of a high work function material, and the second electrode layer is made of a low work function material.

17. A manufacturing method of an organic light emitting device, comprising steps of:
forming a first electrode layer on a substrate;
forming an organic layer on the first electrode layer; and
forming a second electrode layer on the organic layer, wherein the first electrode layer, the organic layer and the second electrode layer form a laminated region and an inverted region, a structure of the organic layer in the laminated region is different from a structure of the organic layer in the inverted region, at least portions of projections of the laminated region and the inverted region on the substrate are not overlapped, the laminated region is used for emitting light in a first specific color in a positive half cycle of alternating current, and the inverted region is used for emitting light in a second specific color in a negative half cycle of alternating current.

18. The manufacturing method of an organic light emitting device of claim 17, wherein the organic layer comprises a first luminous layer, a second luminous layer and a third luminous layer; and
the step of forming an organic layer on the first electrode layer comprises:
forming the first luminous layer on the first electrode layer, wherein the first luminous layer is positioned in the laminated region;
forming the third luminous layer on the first electrode layer, wherein the third luminous layer is positioned in the inverted region; and
forming the second luminous layer on the first luminous layer, wherein the second luminous layer is positioned in the laminated region.

19. The manufacturing method of an organic light emitting device of claim 18, wherein the organic layer further comprises a first functional layer and a second functional layer, which are arranged in both the laminated region and the inverted region; and
the step of forming an organic layer on the first electrode layer further comprises:
forming the first functional layer on the first luminous layer, wherein the third luminous layer is positioned on the first functional layer; and
forming the second functional layer on the third luminous layer, wherein the second luminous layer is positioned on the second functional layer.

20. A driving method of an organic light emitting display device, wherein the organic light emitting display device comprises an organic light emitting device, which comprises a substrate and a first electrode layer, an organic layer and a second electrode layer which are positioned on the substrate, wherein the organic layer is arranged between the first electrode layer and the second electrode layer, the first electrode layer, the organic layer and the second electrode layer form a laminated region and an inverted region, a structure of the organic layer in the laminated region is different from a structure of the organic layer in the inverted region, and at least portions of projections of the laminated region and the inverted region on the substrate 1 are not overlapped; and
the driving method comprises steps of:
applying a positive half cycle signal of alternating current to the laminated region, so that the laminated region emits light in a first specific color; and
applying a negative half cycle signal of alternating current to the inverted region, so that the inverted region emits light in a second specific color.

* * * * *